United States Patent
Sung et al.

[11] Patent Number: 5,770,470
[45] Date of Patent: Jun. 23, 1998

[54] HIGH TEMPERATURE SUPERCONDUCTING ELECTRIC FIELD EFFECT DEVICE AND A METHOD FOR FABRICATING THE SAME

[75] Inventors: Gun-Yong Sung; Jeong-Dae Suh, both of Daejeon, Rep. of Korea

[73] Assignee: Electronics and Telecommunications Research Institute, Daejeon, Rep. of Korea

[21] Appl. No.: 694,300

[22] Filed: Aug. 8, 1996

[30] Foreign Application Priority Data

Dec. 21, 1995 [KR] Rep. of Korea ................ 95-53636

[51] Int. Cl.[6] .................................................. H01B 12/00
[52] U.S. Cl. ......................... 438/2; 505/193; 505/922; 505/923
[58] Field of Search ..................... 29/25.02; 505/190, 505/193, 922, 923; 438/2

[56] References Cited

U.S. PATENT DOCUMENTS

| | | | |
|---|---|---|---|
| 5,236,896 | 8/1993 | Nakamura et al. | 505/1 |
| 5,278,136 | 1/1994 | Bednorz et al. . | |
| 5,322,526 | 6/1994 | Nakamura et al. . | |
| 5,430,013 | 7/1995 | Inada et al. | 505/235 |
| 5,447,907 | 9/1995 | Nakamura et al. | 505/193 |
| 5,539,215 | 7/1996 | Nakamura et al. | 257/39 |
| 5,593,950 | 1/1997 | Mukaida et al. | 505/234 |

FOREIGN PATENT DOCUMENTS

| | | |
|---|---|---|
| 0478466 | 4/1992 | European Pat. Off. . |
| 0533519 | 3/1993 | European Pat. Off. . |

OTHER PUBLICATIONS

Article: Influence of Electric Fields on Pinning in $YBa_2Cu_3O_{7-\delta}$ Films, vol. 67, No. 15, Oct. 7, 1991 J. Mannhart, D.G. Scholm, J.G. Bednorz, and K.A. Muller, pp. 2099–2101.

Article: Electric field effect in high $T_c$ superconducting ultrathin $YBa_2Cu_3O_{7-x}$ films, X.X.Xi, Q.Li, C.Doughty, C. Kwon, S. Bhattacharya, A.T. Findikoglu and T. Venkatesan, pp. 3470–3472. Dec. 1991.

Large electric field effects in $YBa_2Cu_3O_{7-\delta}$ films containing weak links, J. Mannhart, J. Strobel, J.G. Bednorz and Ch. Gerber pp. 630–632, Feb., 1993.

Electric Field Effects on $YBa_2CU_3O_{7-\delta}$ Grain Boundary Josephson Junctions, Kensuke Nakajima, Kazuki Yokota, Jian Chen, Hiroaki Myoren and Tsutomu Yamashita, vol. 33(1994) pp. L934–L937, Jul., 1994.

Primary Examiner—John Niebling
Assistant Examiner—Richard A. Booth
Attorney, Agent, or Firm—Antonelli, Terry, Stout, & Kraus, LLP

[57] ABSTRACT

The invention relates to a high temperature superconducting electric field effect device which creates a dual grain boundary on a superconducting thin film and employs it as a channel. The device comprises a substrate, a bottom layer formed on a predetermined region of the bottom layer, a dual grain boundary channel region formed on the bottom layer, a high temperature source and a drain formed at both end portions of the channel region on the substrate, a high temperature superconducting thin film channel layer formed a predetermined region on the source, the drain and the substrate, dual grain boundaries formed on the high temperature superconducting thin film channel layer, and a gate insulating layer formed on the dual grain boundary channel region.

23 Claims, 3 Drawing Sheets

HIGH TEMPERATURE SUPERCONDUCTING ELECTRIC FIELD EFFECT DEVICE AND A METHOD FOR FABRICATING THE SAME

FIELD OF THE INVENTION

The present invention relates to a high temperature superconducting electric field effect device and a method for the fabrication thereof; and, more particularly, to a high temperature superconducting electric field effect device which creates dual grain boundary on the superconducting thin film to employ as a channel, and a method for fabricating the same.

BACKGROUND OF THE INVENTION

In general, an electric field effect device having a high temperature superconducting thin film comprises a substrate having deposited thereon a high temperature oxide superconducting thin film, a superconducting channel of the oxide superconducting thin film, a superconducting source electrode and a superconducting drain electrode. In the electric field effect device, a superconducting current flows through the superconducting channel between the source and the drain electrodes, and a gate electrode is deposited on an insulating layer which is positioned above the superconducting channel, thus, the superconducting current passing through the superconducting channel between the superconducting source and the drain electrodes is controlled by a voltage applied to the gate electrode(see, X. X. Xi et al., Appl. Phys. Lett. 59(26): 3470–3472, 1991).

The description of the high temperature superconducting electric field effect device previously described, which utilize such high temperature superconducting thin film as a channel, is disclosed in the following articles.

In EP 484,253 A2, a structure which completely isolates the superconducting source from the superconducting drain by filling both sides of the gate electrode with an insulating material, is described. In EP 523,275 A1, an inverse stacked MISFET structure including a conducting substrate of a gate electrode, an insulating barrier layer, and an superconducting channel is described. In U.S. Pat. No. 5,278,136, a structure which forms a interface layer between a gate electrode and a insulating layer so as to prevent the performance of the gate substrate from degrading is disclosed.

In addition, in EP 478,466 A1, there is described a structure in which a portion of the superconducting thin film layer is formed as an anti-superconducting layer to thereby thin it to realize weak links. In EP 533,519 A2, there is described a structure in which an oxide layer between a superconducting channel and a gate insulating layer is interposed so as to form a superconducting thin film surface. Furthermore, in U.S. Pat. No. 5,322,526 a structure which formed a superconducting channel by exposing a certain portion of the substrate in order to utilize an extremely thin superconducting channel is described.

In the meantime, a trilayer structure which inversely stacks the high temperature superconducting electric field effect device mentioned above composed of a thin film metal layer, a thin film insulating layer, and a high temperature thin superconducting layer, i.e., a sequence of the high temperature thin superconducting layer, the thin film insulating layer and the thin film metal layer, is also described(see, J. Mannhart et al., Phys.Rev. Lett., 67(15): 2099–2101, 1991)

In addition, there has been proposed an electric field effect device which utilizes a gate on the portion of weak links which is intentionally created on a high temperature oxide superconducting thin film. In such device, a grain boundary which functions as weak links in the high temperature superconducting thin film is created for use as a channel. That is, in such electric field effect device a plurality of grooves are initially formed by polishing a certain portion of a substrate to be deposited on the high temperature superconducting thin film, and the high temperature superconducting thin film is then grown on the substrate, and a group of the grain boundary on the high temperature superconducting thin film which is grown on the portion of the substrate provided with the plurality of grooves is then created, hence, the grain boundary so created is used as the channel in the electric field effect device.(see, J. Mannhart et al., Appl. Phys. Lett., 62(6):630–632, 1993)

Likewise, an electric field effect device which utilizes a grain boundary as a channel is further described. Specifically, such device makes the high temperature superconducting thin film grow by using a polycrystal substrate obtained through the junction between two single crystals, which are oriented in different direction relative to each other, thereby creating the grain boundary to be used as the channel for the high temperature superconducting thin film grown on the junction portion of the polycrystal(see, K. Nakajima et al., Jpn. J. Appl. Phys. Lett., 33(7A) :L934–L937(1994), and Z.G. Ivanov et al., IEEE Transactions on Applied Superconductivity, 3(1):2925–2928, 1993).

In the above described high temperature superconducting electric field effect device, a mechanical processing is performed with respect to the single crystal substrate to be deposited on the high temperature superconducting thin film so as to create the grain boundary on the thin film. Such method for forming a number of groove on the substrate, however, suffers from the disadvantage that it entails a complicated process and it is more difficult to control the number and the depth of grooves during the polishing of the substrate. As a result, it is difficult to control the number of grain boundaries, since multiple-step processes such as a sequence of polishing, rinsing and heating are performed.

In particular, the prior art method employing the polycrystal have a shortcoming that even if it is easier to control the number of grain boundaries, the use of the polycrystal entails a higher cost than that of the single crystal to thereby degrade the efficiency of the device.

In addition, the prior art high temperature superconducting electric field effect device described above suffers from a defect that it is difficult to accurately control current flows through between the superconducting source and the superconducting drain during the operation thereof, to thereby degrade an electric field effect, thus entailing the degradation of the performance and the efficiency thereof.

SUMMARY OF THE INVENTION

It is, therefore, a primary object of the present invention to provide a high temperature superconducting electric field effect device which is capable of accurately controlling current passing through between a superconducting source and a superconducting drain during the operation thereof to enhance the electric field effect, thereby providing an improved efficiency.

It is a further object of the present invention to provide a method which is capable of easily and economically fabricating a high temperature superconducting electric field effect device through the use of a simplified process.

In accordance with one aspect of the present invention, there is provided a high temperature superconducting electric field effect device which comprises:

a substrate;

a bottom layer formed on a predetermined region of the substrate;

a dual grain boundary channel region formed on the bottom layer;

a high temperature superconducting source and a high temperature superconducting drain, formed at both end portions of the channel region on the substrate.

a high temperature superconducting thin film channel layer formed on a predetermined region of the high temperature source, the high temperature drain and the substrate;

a dual grain boundary formed on the high temperature superconducting thin film channel layer; and a gate insulating layer formed on the dual grain boundary channel region, wherein, it is preferable that a superconducting thin film forming the high temperature source and the drain is composed of a c-axis oriented YBCO type compound oxide superconducting thin film, and the dual grain boundary channel region is composed of an a-axis oriented type compound oxide superconducting thin film.

In addition, it is preferably that a 90 degree grain boundary is formed at the end of both sides of the bottom layer by using the superconducting oxide bottom layer, thereby making it the dual grain boundary in the high temperature superconducting thin film channel layer to align in serial form.

Furthermore, it is preferably that the gate insulating layer is positioned at the top of the dual grain boundary to thereby control an electric charge density in two grain boundary.

According to another of the present invention, there is provided a method for manufacturing a high temperature superconducting field effect device, which comprises the steps of:

(a) forming a high temperature superconducting thin film on a substrate under a predetermined pressure and a predetermined substrate temperature, to thereby form a high temperature source and a high temperature drain with a predetermined thickness;

(b) growing an oxide on the substrate with a predetermined thickness under a predetermined pressure and a predetermined substrate temperature and etching the grown oxide to thereby form a bottom layer;

(c) forming and etching a high temperature superconducting thin film on the bottom layer, the high temperature source and the high temperature drain with a predetermined thickness under a predetermined pressure and a predetermined substrate temperature, to thereby form a high temperature superconducting thin film channel layer and a dual grain boundary channel region;

(d) depositing and etching a gate insulating layer on the channel region with a predetermined thickness under a predetermined pressure and a predetermined substrate temperature, to thereby form the gate insulating layer; and (e) forming a metal electrode layer on the high temperature superconducting source, the high temperature superconducting drain and the gate insulating layer.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Figure 1:
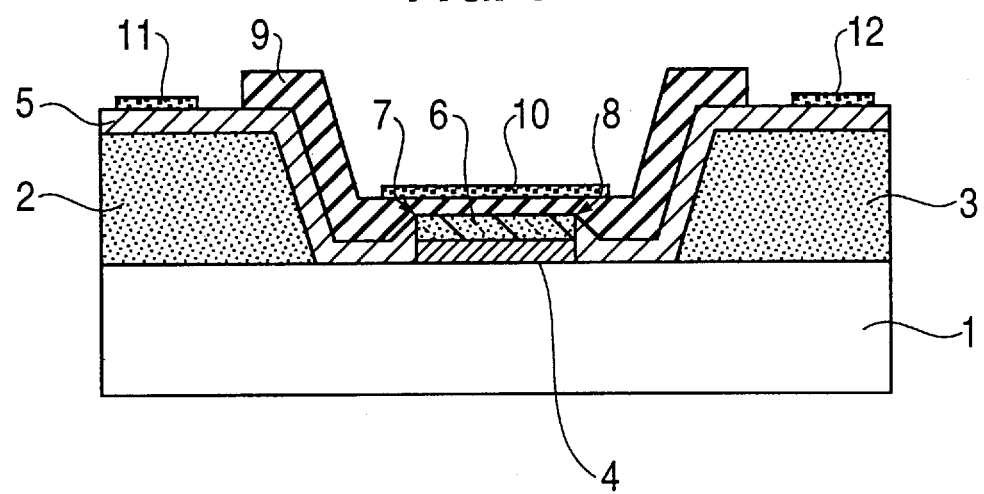
FIG. 1 shows a cross sectional view of an inventive high temperature superconducting field effect device in accordance with the present invention.

There is shown in FIG. 1 a cross sectional view of an inventive high temperature superconducting electric field effect device in accordance with the present invention.

As shown in FIG.1, the invention device comprises a substrate 1, a bottom layer 4 positioned on a predetermined region above the substrate 1, a dual grain boundary channel region 6 formed on the bottom layer 4, a high temperature superconducting source 2 and drain 3 formed at both sides of the channel region 6 in the substrate 1, a thin film channel layer 5 formed on a predetermined region in the source 2, the drain 3 and the substrate 1, a dual grain boundary 7, 8 formed on the thin film channel layer 5, and a gate insulating layer 9 formed on the dual grain boundary channel region 6.

In this case, a superconducting current can flow through the channel region 6 interposed between a high temperature superconducting source electrode 11 and a high temperature superconducting drain electrode 12.

Furthermore, a gate electrode 10 positioned on the gate insulating layer 9, which is deposited at a portion of the high temperature superconducting thin film creates the dual grain boundaries 7 and 8, and controls the superconducting current passing across the grain boundary.

A high temperature oxide superconducting thin film constituting the source 2 and the drain 3, in this case, includes a c-axis oriented oxide superconducting thin film perpendicular to the surface of the substrate 1.

The dual grain boundaries 7 and 8 are formed within the thin film channel layer 5 deposited on the bottom layer 4, that is, which they are formed at end of both sides of the bottom layer 4.

Referring to FIGS. 2A to 2E, there are shown a schematic cross sectional view setting forth the manufacturing steps for the inventive device in accordance with the present invention.

Hereinafter, a method for manufacturing a high temperature superconducting field effect device which utilizes a YBCO($YBa_2Cu_3O_{7-x}$) type compound superconducting thin film will be described in detail described with reference to FIGS.2A to 2E.

Figure 2A:
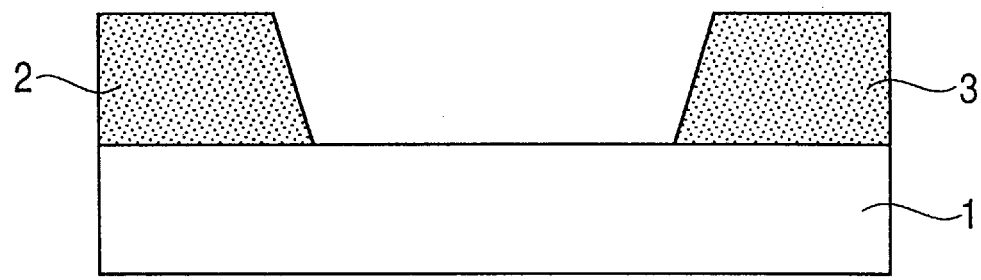
FIGS. 2A to 2E offer schematic cross sectional view setting forth the manufacturing steps for the inventive high temperature in accordance with the present invention.

As shown FIG.2A, the source 2 and the drain 3 first formed on the substrate 1, wherein the substrate 1 is formed of, for example, an insulator substrate such as an oxide single crystal substrate: $SrTiO_3$(100) and a $LaSrGaO_4$(100) or others. The source 2 and the drain 3 having a thickness on the order of about 300 nanometers are manufactured by performing a pulse laser deposition method with respect to a c-axis orientated YBCO oxide superconducting thin film, under a pressure of gate electrode 100 mTorr and a substrate temperature within the range from 750° C. to 800° C.

Figure 2B:
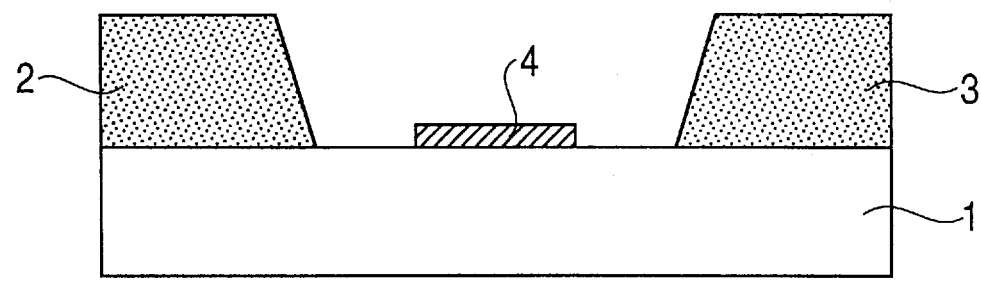

In the ensuing step, there is grown a $PrBa_2Cu_3O_{7-x}$ (PBCO) type compound oxide on the substrate 1 through the use of pulse laser deposition under a pressure of gate electrode 100 mTorr and a substrate temperature of 750° C. to 800° C., and having a thickness on the order of about 300 nanometers, then the bottom layer 4 is formed on the substrate 1 by using an argon ion beam etching as shown in FIG.2B.

Figure 2C:
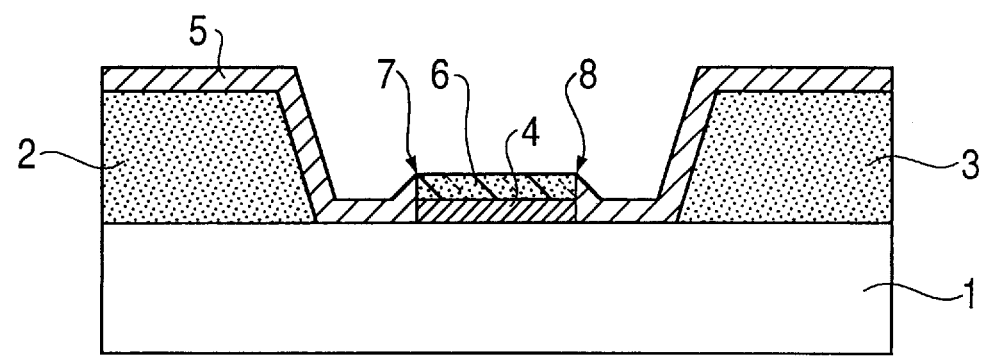

In the subsequent step, there is shown a manufacture step for forming a high temperature superconducting thin film channel layer, wherein the YBCO thin film is deposited on a semifinished structure shown in FIG.2B under the same condition as that of the YBCO thin film deposition, having a thickness on the order of about 100 nanometers. In this case, as shown in FIG.2C, the channel region 6 deposited on a portion containing the bottom layer 4 have an a-axis orientated superconducting thin film, and the other portion not containing the bottom layer 4 have a c-axis orientated superconducting thin film. Because of this difference, 90 degree grain boundaries dual grain boundary 7, 8 are created at the end of both sides of the bottom layer 4. Thereafter, the thin film channel layer 5 is etched by means of an argon ion beam etching method.

Figure 2D:
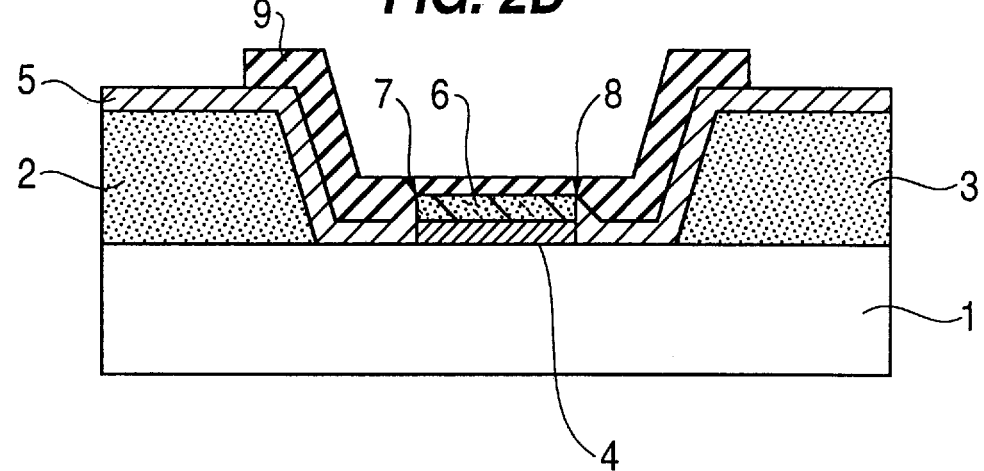

Subsequently, As as shown in FIG.2D, the gate insulating layer 9 is deposited on a semifinished structure shown in FIG.2C and then is etched, wherein the gate insulating layer 9 is formed of a $SrTiO_3$ oxide and deposited on the semifinished structure under a pressure of 100 mTorr and a substrate temperature of 700° C. to 750° C., and has a thickness on the order of about 200 nanometers.

Figure 2E:
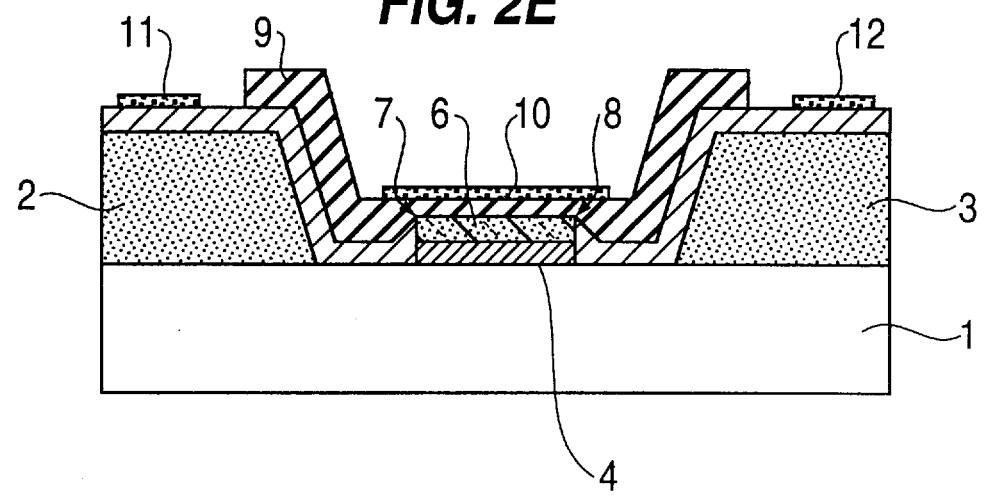

Finally, as shown in FIG. 2E, metal electrode such as the high temperature source electrode layer 11, the high temperature drain electrode layer 12 and the gate electrode layer 10 are formed on the source 2, the drain 3 and the gate insulating layer 9, respectively. Such electrodes are formed of, for example, a metal material such as Ag, or Au, and are deposited with a thickness on the order of about 100 nanometers through the use of a thermal deposition method, and then etched by means of the argon ion beam etching method, to thereby obtain the invention high temperature superconducting electric field effect device.

In the structure of the high temperature superconducting electric field effect device manufactured in accordance with the above mentioned process, since only the channel region 6 deposited on the bottom layer 4 is an a-axis orientated $YBa_2Cu_3O_{7-x}$(YBCO) region, and all of the other channel regions are c-axis orientated YBCO regions, it is possible to control a current flowing through between the high temperature source and the high temperature drain. In addition, since the dual grain boundaries are used, the use of the dual grain boundary enhances an electric field effect by more than twice that of a single grain boundary.

As explained above, the invention provides a high temperature superconducting electric field effect device which is capable of controlling a current passing through between the source and the drain by a voltage applied to a gate insulator layer. Furthermore, the dual grain boundary to be used as a channel have more than double the electric field effect in comparison to a single grain boundary, and in contrast to the method disclosed previously, since the invention does not utilize expensive polycrystal, it is possible to manufacture the high temperature superconducting electric field effect device having an improved performance and efficiency.

While the present invention has been described with respect to certain preferred embodiments only, other modifications and variations may be made without departing from the scope of the present invention as set forth in the following claims.

What is claimed is:

1. A method for manufacturing a high temperature superconducting electric field effect device comprises the steps of:
    (a) forming a high temperature superconducting thin film on a substrate, to thereby form a high temperature source and a high temperature drain with a predetermined thickness;
    (b) growing an oxide on the substrate and etching the grown oxide to thereby form a bottom layer;
    (c) forming and etching said high temperature superconducting thin film on said bottom layer, the high temperature source and the high temperature drain being a c-axis superconductor thin film, to thereby form a high temperature superconducting thin film channel layer and a dual grain boundary channel region;
    (d) depositing and etching a gate insulating layer on the channel region, to thereby form the gate insulating layer; and
    (e) forming a metal electrode layer on the high temperature source, the high temperature drain and the gate insulating layer.

2. The method of claim 1, wherein the substrate is an insulator substrate.

3. The method of either of claims 1 or 2, wherein the substrate is an oxide single crystal insulator substrate such as $SrTiO_3(100)$ or $LaSrGaO_4(100)$.

4. The method of claim 1, wherein the high temperature source, the high temperature drain and the thin film channel layer are formed by using a c-axis orientated YBCO type compound high temperature superconducting thin film.

5. The method of claim 1, wherein the high temperature source, the high temperature drain, the bottom layer, the thin film channel layer, and the gate insulating layer are formed by using a pulse laser deposition method.

6. The method of claim 1, wherein the high temperature source, the high temperature drain, the bottom layer, the thin film channel layer, and the gate insulating layer are formed with a predetermined thickness under a specific pressure of 85 to 120 mTorr.

7. The method of claim 1, wherein the high temperature source, the high temperature drain, the bottom layer, the thin film channel layer, and the gate insulating layer are formed under a specific substrate temperature of 650° C. to 900° C.

8. The method of claim 1, wherein the high temperature source and the high temperature drain are formed with a thickness of 250 to 350 nanometers.

9. The method of claim 1, wherein an oxide during the formation of the bottom layer is a $PrBa_2Cu_3O_{7-x}$ oxide.

10. The method of claim 1, wherein the oxide is grown under a a specific substrate temperature of 500° C. to 750° C., during the formation of the bottom layer.

11. The method of claim 1, wherein the oxide is grown with a thickness of 85 to 115 nanometers.

12. The method of claim 1, wherein the bottom layer and the thin film channel layer are etched by an argon ion etching method during the formation thereof.

13. The method of claim 1, wherein the thin film channel layer is formed with a thickness of 85 to 115 nanometers.

14. The method of claim 1, wherein a portion not containing the bottom layer in the thin film channel layer has a c-axis orientation.

15. The method of claim 14, wherein a 90 degree grain boundary is formed at end of both sides of the bottom layer depending on a differential orientation between a portion containing the bottom layer and the portion not containing the bottom layer in the thin film channel layer.

16. The method of claim 1, wherein the gate insulating layer is an oxide layer.

17. The method of claim 1, wherein the gate insulating layer is a $SrTiO_3$ oxide layer.

18. The method of claim 1, wherein the gate insulating layer is formed with a thickness of 180 to 220 nanometers.

19. The method of claim 1, wherein said step (e) includes:
   (e1) depositing a metal with a predetermined thickness; and
   (e2) etching the deposited metal.

20. The method of claim 19, wherein the metal is deposited by using a thermal deposition method.

21. The method of claim 19, wherein the metal is deposited with a thickness of 85 to 115 nanometers during the deposition thereof.

22. The method of claim 1 or 19, wherein the metal electrode is made of materials including Ag and Au.

23. The method of claim 19, wherein said step (e2) is performed by using ion beam etching.

* * * * *